United States Patent [19]
Yamaha et al.

[11] Patent Number: 5,885,857
[45] Date of Patent: Mar. 23, 1999

[54] SEMICONDUCTOR CHIP CAPABLE OF SUPPRESSING CRACKS IN THE INSULATING LAYER

[75] Inventors: Takahisa Yamaha; Yushi Inoue; Masaru Naito, all of Hamamatsu, Japan

[73] Assignee: Yamaha Corporation, Japan

[21] Appl. No.: 7,619

[22] Filed: Jan. 15, 1998

Related U.S. Application Data

[62] Division of Ser. No. 637,227, Apr. 24, 1996.

[30] Foreign Application Priority Data

Apr. 27, 1995 [JP] Japan .................................. 7-103847

[51] Int. Cl.$^6$ ...................... H01L 21/283; H01L 21/306; H01L 21/311; H01L 21/316
[52] U.S. Cl. .................. 438/129; 438/519; 438/611; 438/669; 438/680; 438/685; 438/686; 438/688; 438/694; 438/763; 438/780
[58] Field of Search ................... 438/129, 599, 438/611, 669, 680, 685, 686, 688, 694, 763, 780, 926, 958, 342, 350, 352, 354, 355, 357, 363, 364, 388, 403, 405

[56] References Cited

U.S. PATENT DOCUMENTS

| | | |
|---|---|---|
| 5,117,280 | 5/1992 | Adachi . |
| 5,217,917 | 6/1993 | Takahashi et al. . |
| 5,488,007 | 1/1996 | Kim et al. . |
| 5,747,380 | 5/1998 | Yu et al. . |
| 5,763,057 | 6/1998 | Sawada et al. . |

FOREIGN PATENT DOCUMENTS

| | | |
|---|---|---|
| 3129738 | 7/1990 | Japan . |
| 3136332 | 6/1991 | Japan . |
| 3149824 | 6/1991 | Japan . |
| 3149829 | 6/1991 | Japan . |
| 3196627 | 8/1991 | Japan . |
| 3278537 | 12/1991 | Japan . |
| 0684899 | 3/1994 | Japan . |

*Primary Examiner*—David Graybill

[57] ABSTRACT

A resin molded semiconductor device having wiring layers and interlayer insulating layers inclusive of an SOG film, capable of suppressing generation of cracks in an SOG film to be caused by thermal stress. In the outer peripheral area of a semiconductor chip, via holes are formed in an interlayer insulating layer inclusive of an SOG film to substantially reduce residual SOG film. As an underlying layer of the interlayer insulating layer inclusive of the SOG film, dummy wiring patterns are formed to thin the SOG film on the dummy wiring patterns. Dummy wiring patterns may also be formed by using a higher level wiring layer, burying the via holes and contacting the lower level dummy wiring patterns.

20 Claims, 8 Drawing Sheets

SEMICONDUCTOR CHIP CAPABLE OF SUPPRESSING CRACKS IN THE INSULATING LAYER

This is a Division of application Ser. No. 08/637,227, filed Apr. 24, 1996, U.S. Pat. No. 5,763,936.

BACKGROUND OF THE INVENTION a) Field of the Invention

The present invention relates to a resin molded semiconductor device, and more particularly to a semiconductor device capable of suppressing generation of cracks to be caused by thermal stress at a peripheral area of a semiconductor chip.

b) Description of the Related Art

Common problems associated with resin molded semiconductor devices whose chips are resin-molded, are a shift of wiring patterns and generation of cracks in a passivation film to be caused by thermal stress generated by a difference of thermal expansion coefficients between semiconductor chips and sealing resin.

The surface of a semiconductor chip is generally divided into an inner pattern region where wiring patterns and functional elements such as transistors and resistors are formed, a bonding pad region outside the inner pattern region where bonding pads are disposed, and a reserved region from the outer periphery of the bonding pad region to the chip periphery.

In order to suppress a shift of wiring patterns and generation of cracks in a passivation film to be caused by thermal stress of the semiconductor chip, it has been proposed to form slits in a wiring pattern or form dummy wiring patterns. Most of conventional methods form such crack preventing structures in the inner pattern region.

FIG. 6 is a partial plan view showing an example of the layout of a semiconductor chip. At the outside area of a hatched inner pattern region b, a bonding pad region a is disposed which has a plurality of bonding pads a1 to a5. The bonding pad region a has an area from the outer periphery of the inner pattern region to the line extending through the outer sides of the bonding pads. Each bonding pad is a rectangle having a side length of, for example, about 100 $\mu$m.

An area from the outer periphery of the bonding pad region to the outer periphery of the semiconductor chip is a reserved region c where no circuit element is formed. The reserved region has a width of 20 $\mu$m to 100 $\mu$m and is used for preventing cracks at a scribed surface from entering into the inner pattern region containing functional elements, when the wafer is diced into chips.

FIG. 7 shows an example of a cross sectional structure of a semiconductor chip, showing a portion from a bonding pad to a chip periphery. Formed on the surface of a semiconductor substrate 1 are a field oxide film 2, a first interlayer insulating film 3, and a first wiring layer 4 on the first interlayer insulating film 3. The first wiring layer 4 forms a bonding pad 4a and a metal seal ring pattern 4c. On the surface of the first wiring layer 4, a second interlayer insulating layer 5 and a passivation film 8 of $SiN_x$ are formed. The second interlayer insulating layer 5 is a laminate of a pair of plasma CVD $SiO_2$ films 5a and 5b and a spin-on-glass (SOG) film 6 sandwiched therebetween. In the inner pattern region, a second wiring layer is formed on the second interlayer insulating layer 5 and is covered with the passivation film 8. The surface of the passivation film 8 is sealed with a resin region 9 used for sealing the semiconductor chip.

Many semiconductor devices have a multi-layer structure with a plurality of wiring layers and interlayer insulating layers. If the surface of an underlying layer is uneven, the precision of photolithography is lowered and step coverage of a higher level wiring layer becomes bad so that breakage of wiring layers or other defects are likely to occur. For planarization of the surface of an underlying layer, an SOG film effective for planarization is often used as part of an interlayer insulating layer. If the SOG film alone is used, moisture becomes easy to invade. An interlayer insulating layer including an SOG film between a pair of CVD insulating films is used in most cases.

An SOG film is formed by spin-coating liquid material over the substrate and thereafter heating it. The liquid material may be organic silane containing source material dissolved by solvent or a mixture of $SiO_2$ particles and binder.

The liquid SOG film source material fills a recess in the underlying layer and planarizes the surface. The quality of an SOG film as an insulating film is not good. Therefore, the SOG film may be etched back by setting the etching rates of the SOG film and the underlying layer equal to each other. With this etch-back, the SOG film is left only at the recess, and the other SOG film on the upper flat surface of the stepped underlying layer is removed.

Spin-coated SOG film source material becomes thick and stagnant in a broad area because of a dam formed by the metal seal ring pattern at the chip peripheral area. Even after the etch-back, the SOG film is left in the broad area of the chip peripheral area. If a semiconductor device with such an SOG film is subjected to heat cycle tests, for example, in a temperature range from 150° C. to minus 65° C. about 500 to 1000 times, the interfaces between the broadly stagnant SOG film and CVD insulating films are stripped or peeled off, and therefore cracks are likely to be generated in the SOG film.

FIG. 8 is a diagram sketched from an enlarged photograph of an SOG film cross section of a semiconductor device after heat cycle tests. An SOG film 6 is flaked at either an interface to an upper plasma CVD $SiO_2$ film 5b or to a lower one 5a, and cracks are formed in the SOG film 6.

Cracks are easy to be formed in the SOG film at the reserved region c (refer to FIG. 6) of a semiconductor chip. Cracks are easy to be formed particularly near at the corners of a semiconductor chip where more stress is likely to be applied.

Cracks formed in the SOG film at the reserved region c often induce generation of cracks reaching the inner pattern region b. Moisture may enter from these cracks. If moisture enters further the inner pattern region b, the characteristics of functional elements such as transistors are adversely affected. For example, if moisture reaches an oxide film, $H^+$ions enter the oxide film. If these $H^+$ions reach the gate oxide film, the threshold value of the transistor may vary, or if they reach near the lower interface of the field oxide film, negative charges may be induced in a p-type well, forming an n-type channel. Entered moisture often corrodes electrode material such as Al. Cracks formed in the SOG film may break a higher level wiring pattern.

SUMMARY OF THE INVENTION

It is an object of the present invention to provide a semiconductor device capable of suppressing flakes of an SOG film and generation of cracks.

It is another object of the present invention to provide a method of manufacturing a semiconductor device capable of suppressing flakes of an SOG film and generation of cracks.

According to one aspect of the present invention, there is provided a semiconductor device comprising: a semiconductor chip having an inner pattern region where functional elements and wiring layers are formed, a bonding pad region outside the inner pattern region where bonding pads are formed, and a reserved region extending from an outer periphery of the bonding pad region to a chip periphery, respectively defined on a substrate; an interlayer insulating layer including a coated insulating film, formed on the reserved region and the bonding pad region; and dummy via holes formed in the interlayer insulating layer in the reserved region or in the reserved region and the bonding pad region.

According to another aspect of the present invention, there is provided a semiconductor device comprising: a semiconductor chip having an inner pattern region where functional elements and wiring layers are formed, a bonding pad region outside the inner pattern region where bonding pads are formed, and a reserved region extending from an outer periphery of the bonding pad region to a chip periphery, respectively defined on a substrate; dummy wiring patterns formed on the substrate in the reserved region or in the reserved region and the bonding pad region; and an interlayer insulating layer including a coated insulating film, formed on the reserved region and the bonding pad region, the interlayer insulating layer covering the dummy wiring patterns.

Dummy via holes may be formed in the interlayer insulating layer. These dummy holes may be buried with a conductive film or other films.

According to still another aspect of the present invention, there is provided a method of manufacturing a semiconductor device comprising the steps of: forming an interlayer insulating layer including a coated insulating film on a substrate of a semiconductor chip, the semiconductor chip having an inner pattern region where functional elements and wiring layers are formed, a bonding pad region outside the inner pattern region where bonding pads are formed, and a reserved region extending from an outer periphery of the bonding pad region to a chip periphery, respectively defined on the substrate; and forming dummy via holes in the interlayer insulating layer in the reserved region or in the bonding pad region and the reserved region, by selectively etching the interlayer insulating layer.

According to a further aspect of the present invention, there is provided a method of manufacturing a semiconductor device comprising the steps of: forming a conductive film on a substrate of a semiconductor chip, the semiconductor chip having an inner pattern region where functional elements and wiring layers are formed, a bonding pad region outside the inner pattern region where bonding pads are formed, and a reserved region extending from an outer periphery of the bonding pad region to a chip periphery, respectively defined on the substrate; forming dummy wiring patterns in the reserved region or in the bonding pad region and the reserved region, by selectively etching the conductive film; and forming an interlayer insulating layer including a coated insulating film over the substrate, the interlayer insulating layer covering the dummy wiring patterns.

The method may further comprise the step of forming dummy via holes in the interlayer insulating layer in the reserved region or in the bonding pad region and the reserved region. The method may still further comprise the steps of forming a conductive film in the dummy via holes and on the interlayer insulating layer; and forming dummy wiring patterns by selectively etching the conductive film, the dummy via holes being buried with the conductive film.

Dummy via holes in the interlayer insulating layer substantially reduce the area of the residual SOG film and prevent the residual SOG film from being left in the broad area. Since the residual SOG film is not left in the broad area, the SOG film and other insulating films are not likely to be peeled off at their interface, which is otherwise caused by thermal stress, and therefore cracks become hard to be generated in the SOG film.

Presence of dummy wiring patterns forms an uneven bottom surface for the SOG film on the dummy wiring patterns. This uneven bottom surface for the SOG film makes the stress applied to the interface between the SOG film and other insulating films disperse in the vertical and horizontal directions relative to the interface plane. Therefore, flakes or peel-off of the SOG film at the interface is not likely to occur.

The wiring layer burying the via holes functions as the wedge which prevents a shift of the interlayer insulating layer to be caused by thermal stress.

Dummy wiring patterns or dummy via holes can be formed in the chip outer peripheral region by merely changing the mask patterns without giving any particular load on conventional semiconductor device manufacturing processes. These dummy wiring or via hole patterns suppress generation of cracks in the SOG film which are otherwise to be caused by thermal stress and prevent degradation of the performance of functional elements such as transistors formed in the inner pattern region.

DETAILED DESCRIPTION OF THE PREFERRED EMBODIMENTS

Figure 6:
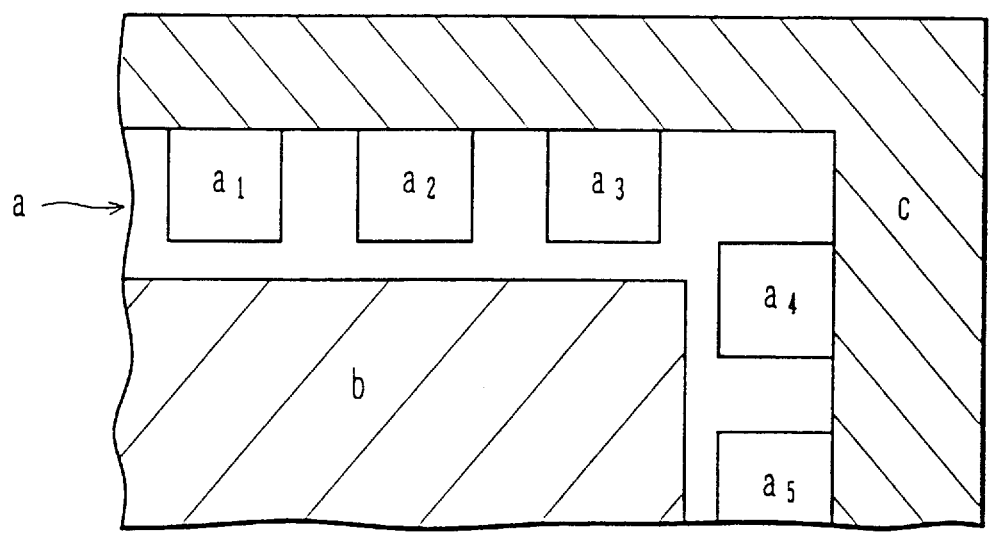
FIG. 6 is a plan view showing part of the peripheral area of a semiconductor chip.
Figure 7:
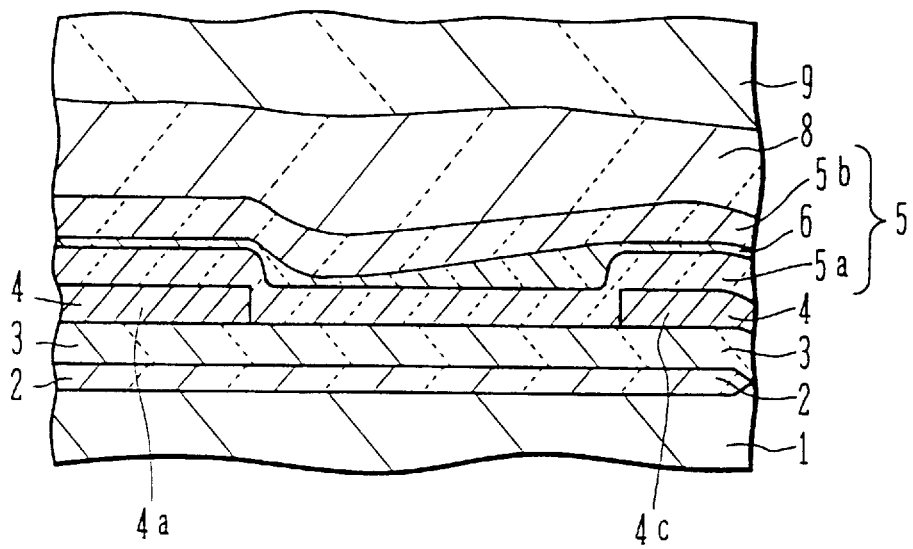
FIG. 7 is a cross sectional view showing an example of a conventional semiconductor device.
Figure 8:
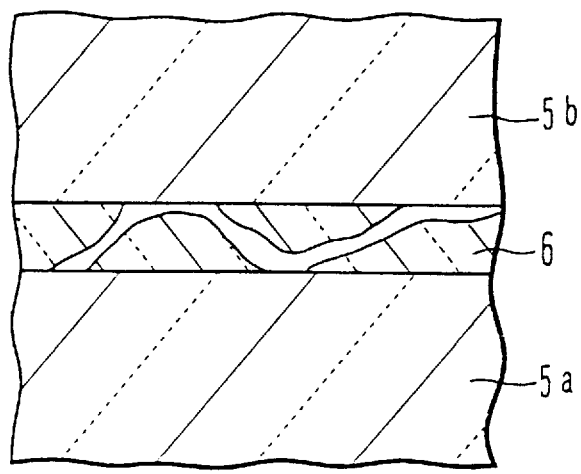
FIG. 8 is a diagram sketched from a photograph showing cracks formed in an SOG film by thermal stress.

A method of manufacturing a semiconductor device according to an embodiment of the invention will be described with reference to the accompanying drawings. FIGS. 1A to 1H are partial cross sectional views of a semiconductor chip illustrating main manufacturing processes of a semiconductor device. This semiconductor chip has a plan layout such as shown in FIG. 6. In the inner pattern region b, transistors, resistors, wiring patterns, and other functional elements are formed. FIGS. 1A to 1H show an area from bonding pads to the chip periphery, this area is called hereinafter a chip outer peripheral region. The semiconductor wafer at the manufacture processes illustrated in FIGS. 1A to 1H is not still diced and each chip periphery is continuous to the peripheries of adjacent chips. In these cross sectional views, the left side of bonding pads is near the chip center.

A device to be formed in the inner pattern region of a semiconductor chip is not limited, and functional elements such as transistors are formed. The processes described below progress at the same time when a device is formed in the inner pattern region.

Figure 1A:
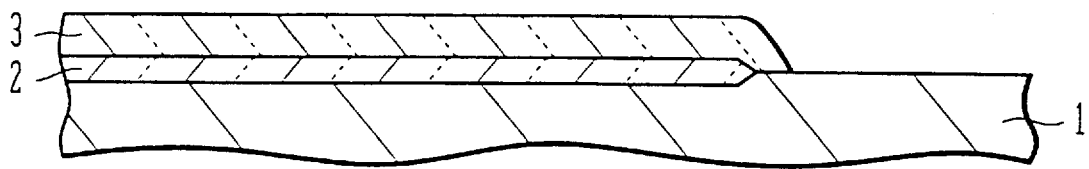
FIGS. 1A to 1H are partial cross sectional views of a semiconductor chip, illustrating a method of manufacturing a semiconductor device according to an embodiment of the invention.

For example, if a plurality of transistors are to be formed in the inner pattern region, first a field oxide film is selectively formed on the surface of a substrate through thermal oxidation using an $SiN_x$ film mask (LOCOS), to thereby isolate each active region. At the same time, as shown in FIG. 1A, a field oxide film 2 is formed in the surface layer of a semiconductor substrate 1 in the chip outer peripheral region.

Thereafter, in the inner pattern region, gate electrodes, source/drain regions, and the like of transistors are formed by well known techniques. Succeedingly, covering this structure, a first interlayer insulating layer is formed over the substrate surface. At the same time, as shown in FIG. 1A, a first interlayer insulating layer 3 is formed also in the chip outer peripheral region. This first interlayer insulating layer 3 is formed, for example, by forming a phosphosilicate glass (PSG) film to a thickness of 100 nm and a borophosphosilicate glass (BPSG) film to a thickness of 750 nm successively through low pressure CVD and thereafter by reflowing the BPSG film at about 1000° C.

Figure 1B:
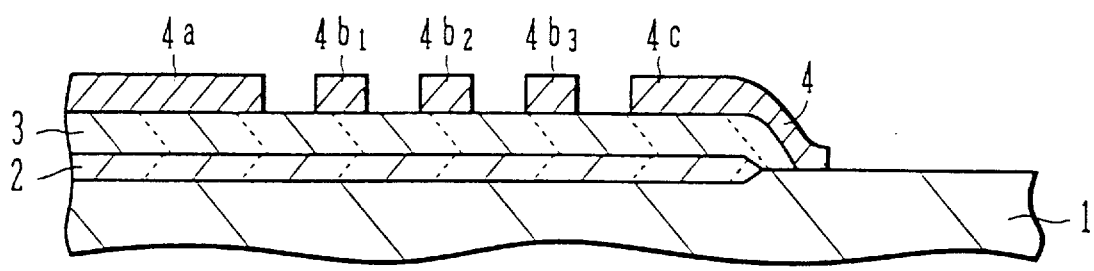

In the inner pattern region, contact holes are formed in the first interlayer insulating layer 3 in order to form electrodes led from the source/drain regions. Thereafter, a first wiring layer is formed over the whole surface of the substrate, filling the contact holes. At the same time, as shown in FIG. 1B, a first wiring layer 4 is formed also in the chip outer peripheral region. This first wiring layer 4 has, for example, a three-layer structure made of a WSi film of 50 nm thick, an AlSiCu alloy film of 500 nm thick, and a WSi film of 50 nm thick respectively formed by sputtering.

A resist film is spin coated on the first wiring layer, exposed and developed to form a resist pattern. By using this resist pattern as an etching mask, the first wiring layer is etched to form necessary wiring patterns. At the same time, by using the first wiring layer 4, a bonding pad lower layer 4a and a metal seal ring pattern 4c are formed also in the chip outer peripheral region. The metal seal ring pattern 4c covers the end portion of the field oxide film 2. At the same time, for example, as shown in FIG. 1B, metal dummy wiring patterns $4b_1$ to $4b_3$ are formed between the bonding pad lower layer 4a and metal seal ring pattern 4c.

Figure 1C:
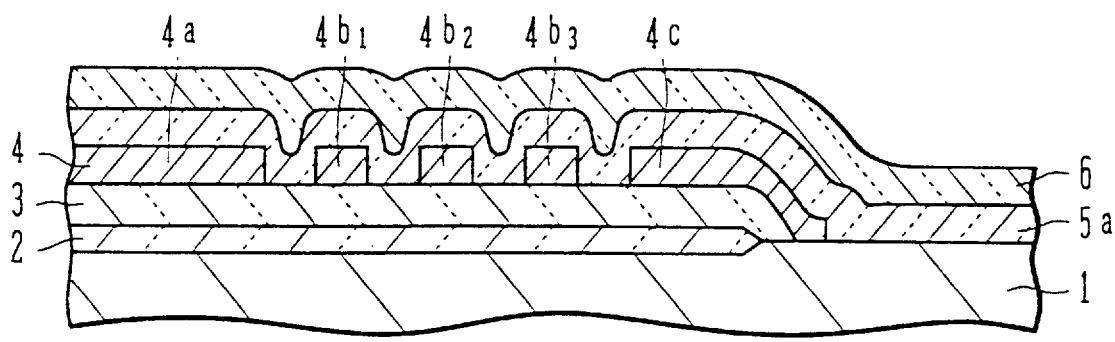

As shown in FIG. 1C, a CVD $SiO_2$ film 5a and an SOG film 6 constituting part of a second interlayer insulating layer are formed over the whole surface of the substrate. For example, the $SiO_2$ film 5a is formed through plasma-enhanced CVD (PECVD) to a thickness of about 500 nm. On this $SiO_2$ film 5a, the SOG film 6 is formed to a thickness of about 500 nm on a higher level flat portion. The SOG film 6 is formed by spin-coating liquid source material with a spinner, and thereafter being cured at a temperature of about 400° C.

Figure 1D:
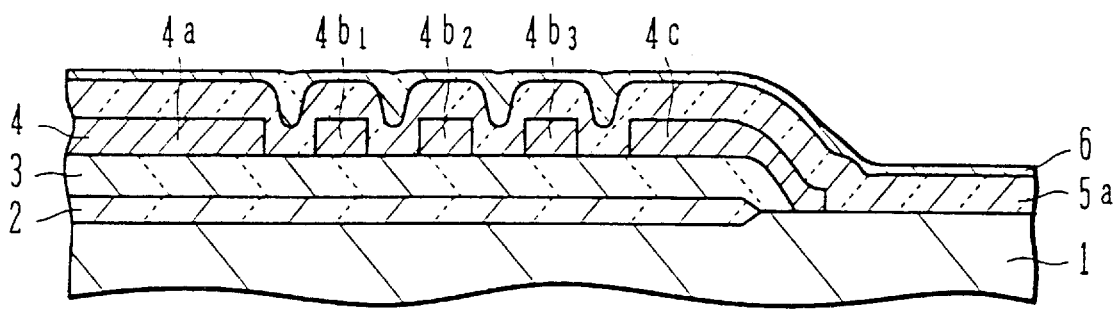

Thereafter, as shown in FIG. 1D, a laminate of the SOG film 6 and the $SiO_2$ film 5a formed through plasma-enhanced CVD (hereinafter called a PECVD $SiO_2$ film) is etched by a thickness of 500 nm generally the same as the deposition thickness of the SOG film 6, by using mainly a mixed gas of $CF_4$ and $CHF_3$ at the etching rates being set equal to the films 6 and 5a. With this etch-back, the SOG film formed on the flat plateau surface in the inner pattern region is removed almost completely. However, in the chip outer peripheral region, the SOG film may be formed thicker than in the inner pattern region because of the function of a dam formed by the metal seal ring pattern 4c. Therefore, the SOG film remains unetched in many cases.

Figure 1E:
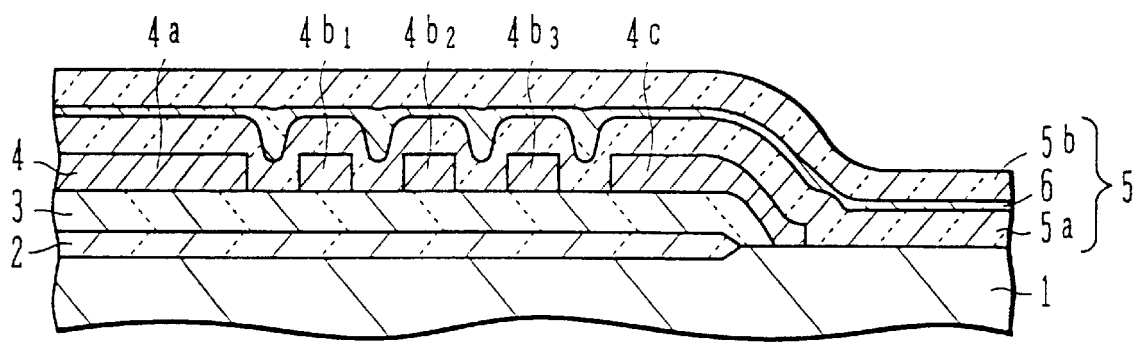

As shown in FIG. 1E, an $SiO_2$ film 5b is formed to a thickness of about 500 nm over the whole surface of the substrate through plasma-enhanced CVD. A three-layer structure of the previously formed PECVD $SiO_2$ 5a and SOG film 6 and this PECVD $SiO_2$ film 5b is called hereinafter a second interlayer insulating layer 5.

Next, via holes are formed in the second interlayer insulating layer 5 for electrical contact with the first wiring layer. A resist film is spin-coated over the substrate surface, exposed and developed to form a resist pattern. Thereafter, by using this resist pattern as an etching mask, the second interlayer insulating layer 5 is etched by using mainly a mixed gas of $CF_4$ and $CHF_3$.

Figure 1F:
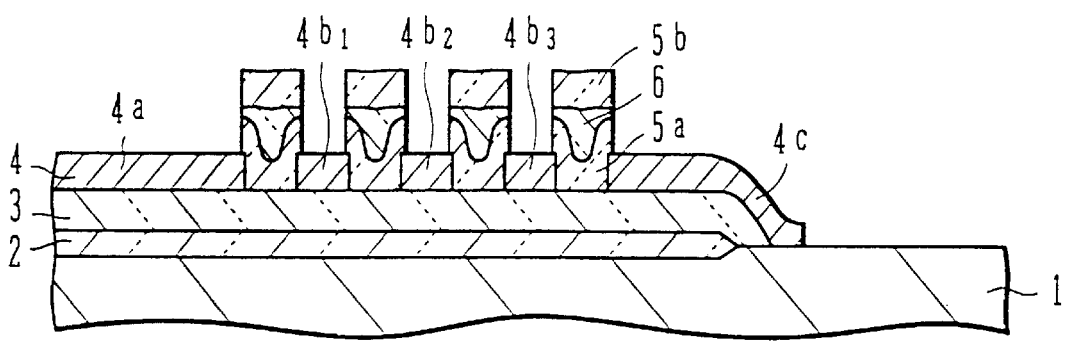

As shown in FIG. 1F, in the chip outer peripheral region, via holes are formed just above the bonding pad lower layer pattern 4a and at the same time, dummy via holes are formed just above the dummy wiring patterns $4b_1$ to $4b_3$. Therefore, the dummy wiring patterns are also exposed. The second interlayer insulating layer 5 just above the metal seal ring pattern 4c and its outer peripheral area is also etched and removed.

Next, a second wiring layer 7 is formed over the substrate surface. For example, the second wiring layer 7 is formed by forming a Ti film to a thickness of about 15 nm and an AlSiCu alloy layer on the Ti film to a thickness of about 1000 nm respectively through sputtering. A resist film is spin-coated over the whole surface of the substrate, exposed and developed to form a resist pattern. By using this resist pattern as an etching mask, the second wiring layer 7 is etched to form necessary wiring pattern in the inner pattern region.

Figure 1G:
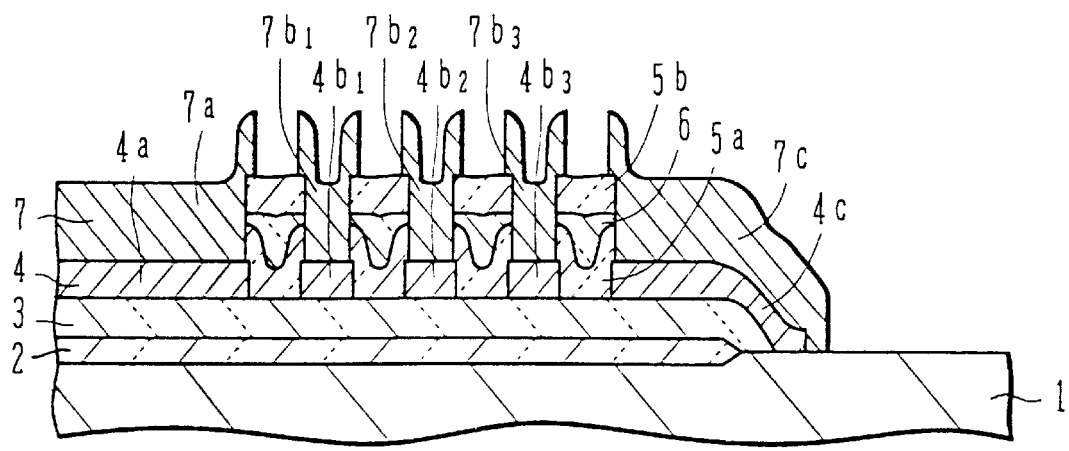

As shown in FIG. 1G, in the chip outer peripheral region, the second wiring layer 7 is etched and removed excepting the second wiring layer portion, burying the via holes formed at the previous process. In this manner, a bonding pad upper layer 7a, a metal seal ring pattern 7c, and dummy wiring patterns $7b_1$ to $7b_3$ are formed. The bonding pad upper layer 7a, metal seal ring pattern 7c, and dummy wiring patterns $7b_1$ to $7b_3$ are mechanically coupled to the bonding pad lower layer 4a, metal seal pattern 4c, and dummy wiring patterns $4b_1$ to $4b_3$, respectively.

Figure 1H:
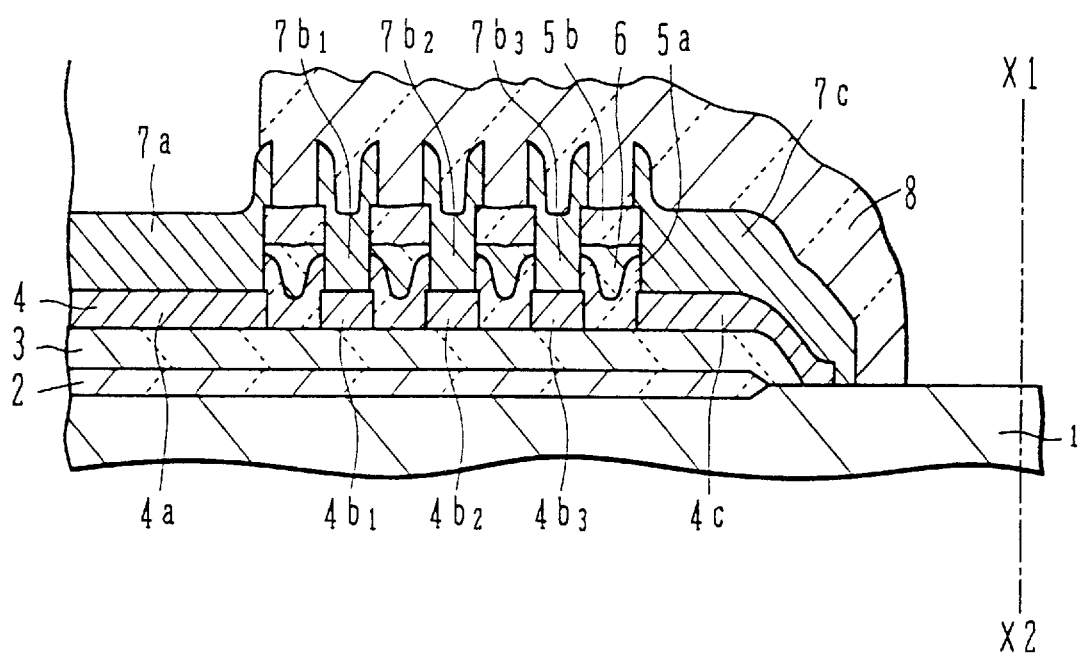

As shown in FIG. 1H, an $SiN_x$ film is formed on the whole surface of the substrate to a thickness of about 1000 nm through plasma-enhanced CVD. This $SiN_x$ film is a passivation film 8. A resist film is coated on the whole surface of the substrate, exposed and developed to form a resist pattern. By using this resist pattern as an etching mask, the passivation film 8 is etched to expose the bonding pads and a scribe region as shown in FIG. 1H. At the same time, in the inner pattern region, a passivation film 8 is formed over the functional elements such as transistors.

As the material of the wiring layers, Al, W, Ti and alloys of W, Ti may also be used as well as Al alloy.

Figure 2:
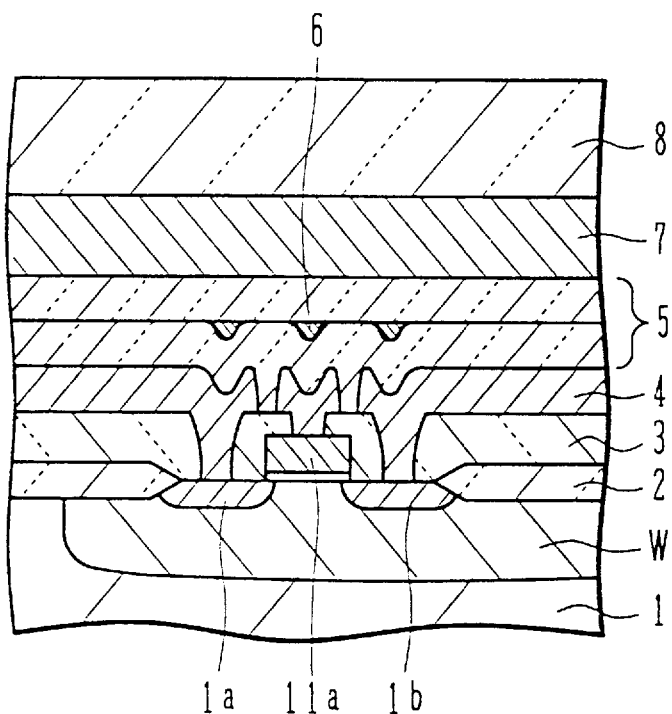
FIG. 2 is a partial cross sectional view showing an example of the structure of the semiconductor chip at an inner pattern region.

FIG. 2 is a cross sectional view showing a MOS transistor formed in the inner pattern region. For example, for an n-channel MOS transistor, a p-type well W is formed in an n-type substrate 1. In the active region defined by a field oxide film 2, a source region 1a, a drain region 1b, and a gate electrode 11a are formed.

A first interlayer insulating layer 3 is formed over the MOS transistor. Through via holes formed in the interlayer insulating layer 3, first wiring layer patterns 4 are connected to the source region 1a, drain region 1b, and gate electrode 11a. Over the first wiring layer pattern 4, a second interlayer insulating layer 5 and a second wiring layer 7 are formed in this order. A passivation film 8 is formed covering the whole surface of the substrate.

In this example, an n-channel MOS transistor is used. Instead, a p-channel MOS transistor may also be formed directly on the n-type substrate in the inner pattern region, without forming p-type wells. Alternatively, p-channel MOS transistors and n-type wells may be formed by reversing all the conductivity types in the example shown in FIG. 2. Various known circuit structures can be employed in the inner pattern region.

Thereafter, the semiconductor substrate 1 is scribed with a dicing saw along one-dot-chain line X1–X2 shown in FIG. 1H to separate it into chips.

Each chip is die-bonded to a lead frame, and thereafter, the ends of inner leads of a lead frame and the bonding pads are wire-bonded. After resin molding, shaping, and marking processes, a resin molded semiconductor device is completed.

A semiconductor device finished by the above-described series of processes can suppress generation of cracks in an SOG film during heat cycle tests, as compared to a conventional semiconductor device.

An SOG film is formed by coating liquid source material with a spinner on the whole surface of a wafer and thereafter being cured by heating it. During coating with a spinner, centrifugal force is applied to liquid source material so that the source material flows radially outward from the wafer center. The thickness of a coated film is not always uniform, but may become thicker at the outer radial area.

Also in each chip, the thickness of an SOG film is likely to become thicker in the chip outer peripheral region at the position more outside the wafer center. If there is a convex portion at a downstream position of the flow direction of liquid source material, this convex portion functions as a dam which stops the flow of liquid source material so that a thick SOG film is likely to be formed inside the convex portion. For example, the metal seal ring at the chip periphery becomes a dam and a pool of SOG liquid source material is likely to be formed inside the dam. In the chip outer peripheral region of a conventional semiconductor chip, no circuit element is formed in the area from bonding pads to the metal seal ring. Therefore, a broad concave portion is formed and the SOG film becomes easy to be stagnant.

As is the case with the above embodiment, most of the SOG film is etched back together with the underlying PECVD SiO$_2$ film and is removed or thinned. However, the SOG film formed thick in the concave portion remains even after the etch-back process.

Cracks may be generated in the SOG film of a conventional semiconductor device after heat cycle tests. Cracks are likely to be formed particularly in the chip outer peripheral region where a thick SOG film remains in the broad area. One of major causes of generating cracks is flakes of the SOG film formed at the interface to the adjacent PECVD SiO$_2$ film to which the SOG film is weakly bonded. It is considered that the thicker the residual SOG film and the broader the residual area, the more the thermal stress is accumulated and the more the cracks are likely to be formed.

In the above embodiment, in the chip outer peripheral region, dummy via holes are formed in the interlayer insulating layer including the SOG film, just above the dummy wiring patterns made of the first wiring layer, and the dummy via holes are buried with the second wiring layer. This structure provides the effects of suppressing generation of cracks in the SOG film.

Dummy via holes formed in the second interlayer insulating layer inclusive of the SOG film in the chip outer peripheral region partially remove the SOG film and the number of border edges of the SOG film increases. Stress accumulated in the SOG film is reduced as the area of the SOG film is made small. Furthermore, stress accumulated in the SOG film is released at the border edges of the SOG film. As the number of dummy via holes is increased, the area of the left SOG film is reduced correspondingly and the broad area of the SOG film extinguishes. The more the dummy via holes are distributed densely, the more the stress release is enhanced. It is therefore possible to disperse the thermally induced stress and suppress generation of cracks in the SOG film.

It is expected that even if dummy via holes only are formed, the effects of suppressing generation of cracks can be obtained.

Figure 3:
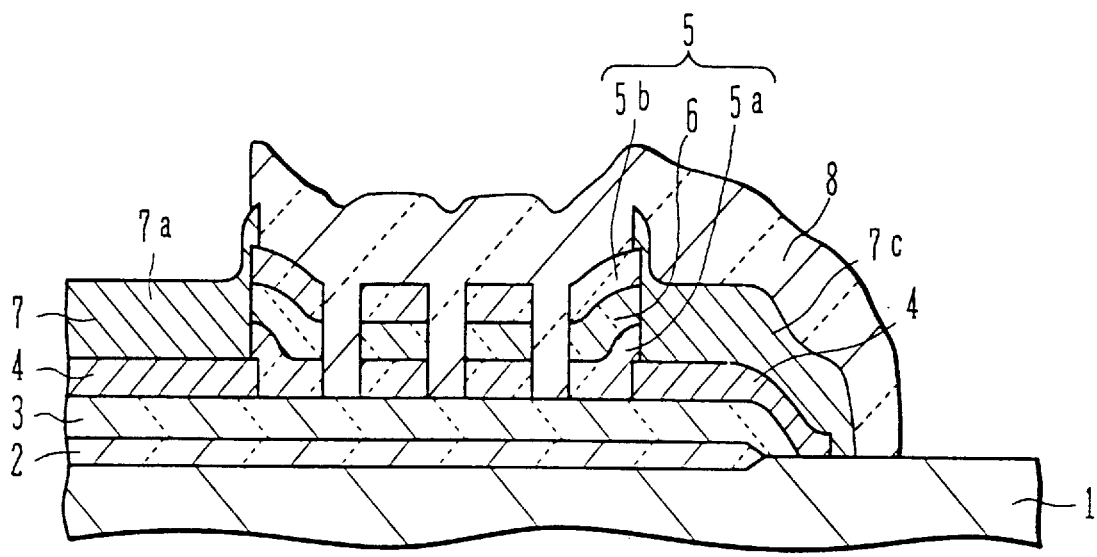
FIG. 3 is a cross sectional view of a semiconductor chip according to another embodiment of the invention.

FIG. 3 shows a structure in which dummy via holes are formed in the second interlayer insulating layer 5 inclusive of the SOG Film in the chip outer peripheral region. As compared to the structure shown in FIGS. 1A to 1H, the dummy wiring patterns made of the first and second wiring layers do not exist. After the second interlayer insulating layer 5 inclusive of the SOG film 6 is formed by conventional processes, via holes for wiring connection and bonding pad formation are formed in the inner pattern region and at the same time dummy via holes are formed in the second interlayer insulating layer 5 in the chip outer peripheral region. The succeeding manufacturing processes are the same as conventional semiconductor manufacturing processes. The depth of a via hole in the second interlayer insulating layer is sufficient if at least the SOG film 6 in the second interlayer insulating layer 5 is substantially etched, and the PECVD SiO$_2$ film 5 under the SOG film 6 may be left unetched. It is preferable to etch the whole thickness of the SOG film 6. Even if the SOG film 6 is formed thick in the chip outer peripheral region, it is not so difficult to form a dummy via hole reaching the PECVD SiO$_2$ film 5a in the chip outer peripheral region while the via hole is formed in the inner pattern region by etching the PECVD SiO$_2$ film 5b, SOG film 6, and PECVD SiO$_2$ film 5a.

The cross section of a dummy via hole is not limited to a particular shape shown in the figure, but any shape may be used, because the object of forming the via hole is to remove the residual SOG film 6. For example, a rectangle, a line pattern, a circle, or other shapes may be used. It is desired that dummy via holes are formed as many as possible to remove the SOG film as much as possible.

In the embodiment shown in FIGS. 1A to 1H, under the dummy via holes in the chip outer peripheral region, the dummy wiring patterns $4b_1$ to $4b_3$ are formed by the first wiring layer 4.

Even in usual manufacturing processes, it is necessary to form via holes in the second interlayer insulating layer 5 in order to expose wiring contact areas in the inner pattern region and bonding pads. The etching of the second interlayer insulating layer 5 required for forming via holes continues until the surface of the first wiring layer 4 is exposed. After dummy wiring patterns are formed in the chip outer peripheral region by selectively etching the first wiring layer 4, dummy via holes are formed in the second interlayer insulating layer 5 just above the dummy wiring patterns. In this case, the second interlayer insulating layers in the inner pattern and chip outer peripheral regions have almost the same thickness. Therefore, without prolonging the etching time required for a usual manufacturing process, it is possible to form dummy via holes and expose the dummy wiring patterns $4b_1$ to $4b_3$ of the first wiring layer 4 in the chip outer peripheral region.

The dummy wiring patterns $4b_1$ to $4b_3$ of the first wiring layer 4 make the bottom surface of the SOG film 6 formed on the first wiring layer 4 uneven so that the contact area between the SOG film 6 and PECVD $SiO_2$ film 5a increases substantially. The uneven bottom surface of the SOG film 6 disperses the thermal stress at the interface between the SOG film 6 and PECVD Sio2 film 5a, in vertical and horizontal directions relative to the plane of the interface. Therefore, flakes at the interface and cracks in the SOG film 6 to be caused by the flakes can be suppressed.

Figure 4:
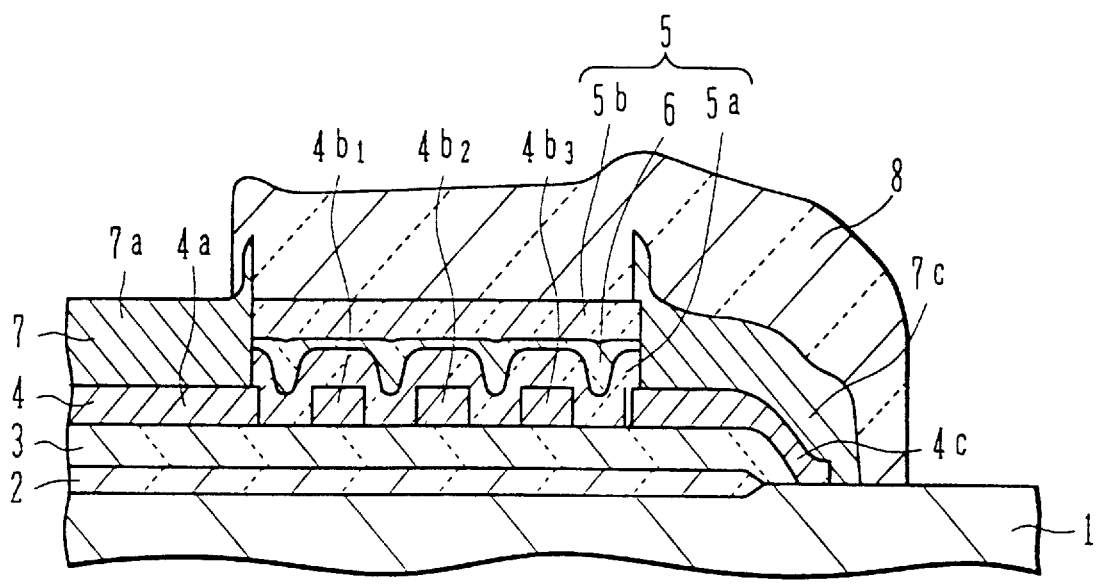
FIG. 4 is a cross sectional view of a semiconductor chip according to still another embodiment of the invention.

FIG. 4 shows another embodiment in which the dummy wiring patterns $4b_1$ to $4b_3$ are formed on the first interlayer insulating layer 3. In this embodiment, although the dummy via holes are not formed in the second interlayer insulating layer 5, generation of cracks can be suppressed by the effect of enlarged contact area as described above.

In the embodiment shown in FIGS. 1A to 1H, the dummy wiring patterns $7b_1$ to $7b_3$ of the second wiring layer 7 are formed burying the dummy via holes in the chip outer peripheral region. The interlayer insulating layer of a semiconductor chip molded with resin may shift toward the chip center during heat cycle tests because of thermal stress. It can be expected that the buried second wiring layer 7 in the dummy via holes functions as a wedge or breakwater for suppressing a shift of the interlayer insulating layer. If a shift of the interlayer insulating layer can be suppressed, generation of cracks in the SOG film 6 can also be suppressed.

Figure 5A:
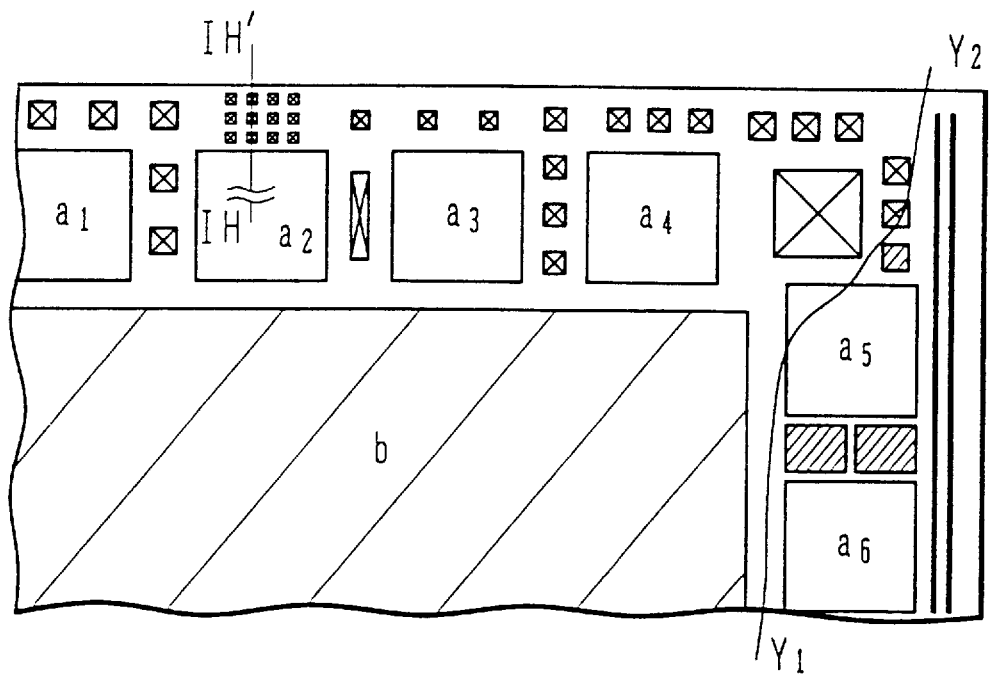
FIGS. 5A and 5B are plan views showing examples of the semiconductor chip at its peripheral area.

FIG. 5A shows an example of a plan layout of dummy via holes and dummy wiring patterns formed in the chip outer peripheral area. The pattern of each dummy via hole is indicated by a rectangular frame with a cross mark. The right portion of FIG. 5A shows dummy wiring patterns with the higher level layers being removed. The right side of a cut line Y1–Y2 corresponds to the area where the higher level layers are removed. The dummy wiring patterns are indicated by hatched rectangles or lines.

In FIG. 5A, the shape of dummy via holes are indicated by squares, rectangles, and line patterns. The shapes of the dummy wiring patterns and dummy via holes may take other shapes.

The dummy wiring patterns formed under the dummy via holes may be generally the same as the dummy via holes, or may take other shapes and sizes, for example, line patterns.

If the width of the dummy wiring pattern is too broad, SOG source material is likely to remain on this broad area and a thick SOG film is formed. Empirically, it is preferable to set the width of the dummy wiring pattern to 40 $\mu$m or narrower, or more preferably 20 $\mu$m or narrower. It is preferable to set the width of the dummy via hole to 40 $\mu$m or narrower, or more preferably 20 $\mu$m or narrower, like the dummy wiring pattern.

The dummy via hole is desired to be formed in the reserved region where the SOG film is likely to become thick. The dummy via hole may be formed in any region so long as it is in the range from the periphery of the inner pattern region to the region where the metal seal ring pattern is formed. It is desired to form a number of dummy via holes so as not to leave a broad area without dummy via holes as much as possible. It is not necessary to form dummy via holes with various shapes such as shown in FIG. 5A, but dummy via holes of only rectangles or lines may also be formed.

The cross sectional view of the chip outer peripheral region shown in FIG. 1H corresponds to the cross sectional view at the cut plane indicated by IH–IH' in FIG. 5A.

Figure 5B:
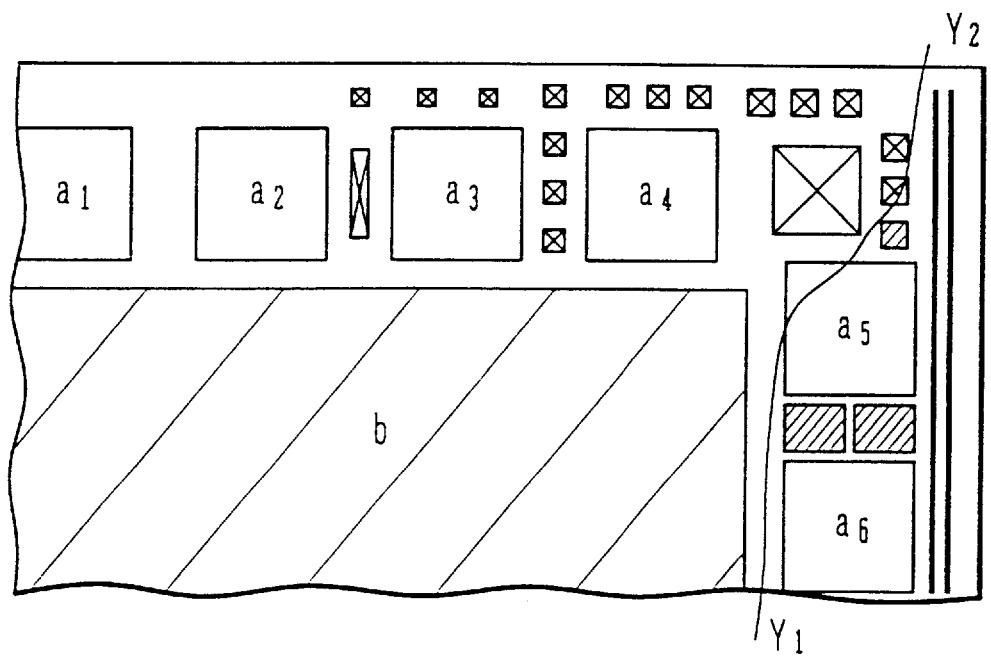

FIG. 5B shows an example of a plan layout of dummy via holes and dummy wiring patterns formed only near the chip corners. If generation of cracks are concentrated in the SOG film near the chip corners, the similar effects to the foregoing embodiments can be obtained.

In the embodiment shown in FIGS. 1A to 1H, after the SOG film 6 is formed, an etch-back process is performed. It is not always necessary to perform this etch-back process. Even in such a case, forming dummy via holes and dummy wiring patterns provides the effects of preventing a broad SOG film 6 from being left, making the SOG film 6 thin, and suppressing generation of cracks in the SOG film 6.

In the above description, the first and second wiring layers are used. Instead, n wiring layers may be used depending upon the device structure in the inner pattern region, where n is 3 or larger. Also in such a case, dummy wiring patterns and dummy via holes can be formed in the similar manner described above. For example, for the n wiring layers, dummy wiring patterns like those of the embodiment may be formed in a wiring layer under an interlayer insulating layer inclusive at least an SOG film, and via holes may be formed in the interlayer insulating layer on the dummy wiring patterns. More preferably, after dummy via holes are formed in each interlayer insulating layer, a wiring layer is formed burying the dummy via holes.

In the above description, a dummy wiring pattern is formed by using a wiring layer. The dummy wiring pattern may also be formed in the chip outer peripheral region by using gate electrode material of a transistor in the inner pattern region at the same time when the gate electrode is patterned. Dummy wiring patterns made of gate electrode material can be expected to provide the similar effects as the dummy wiring patterns made of a wiring layer.

A PECVD $SiO_2$ film is formed on an SOG film. In place of the PECVD $SiO_2$ film, a PECVD $SiN_x$ film, PECVD SiON film, or a BPSG film, etc. may be formed with similar effects.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of manufacturing a semiconductor device comprising the steps of:

forming an interlayer insulating layer including a coated insulating film on a substrate of a semiconductor chip, said semiconductor chip having an inner pattern region where functional elements and wiring layers are formed, a bonding pad region outside said inner pattern region where bonding pads are formed, and a reserved region extending from an outer periphery of said bonding pad region to a chip periphery, respectively defined on said substrate; and forming dummy via holes in said interlayer insulating layer in said reserved region or in said bonding pad region and said reserved region, by selectively etching said interlayer insulating layer.

2. A method of manufacturing a semiconductor device according to claim 1, wherein said coated insulating film is an SOG film.

3. A method of manufacturing a semiconductor device according to claim 2, wherein said step of forming the interlayer insulating layer comprises the steps of:

forming a first insulating film by CVD;

forming an SOG film on said first insulating film; and forming a second insulating film on said SOG film by CVD.

4. A method of manufacturing a semiconductor device according to claim 3, wherein said step of forming the interlayer insulating layer further comprises the step of etching back part of a laminate of said first insulating film and said SOG film, from the surface of the laminate, after said step of forming said SOG film and before said step of forming said second insulating film.

5. A method of manufacturing a semiconductor device according to claim 1, further comprising, after said step of forming said dummy via holes, the steps of:

forming a conductive film in said dummy via holes and on said interlayer insulating layer; and forming dummy wiring patterns by selectively etching said conductive film, said dummy via holes being buried with said conductive film.

6. A method of manufacturing a semiconductor device according to claim 5, wherein said coated insulating film is an SOG film.

7. A method of manufacturing a semiconductor device according to claim 6, wherein said step of forming the interlayer insulating layer comprises the steps of:

forming a first insulating film by CVD;

forming an SOG film on said first insulating film; and forming a second insulating film on said SOG film by CVD.

8. A method of manufacturing a semiconductor device according to claim 7, wherein said step of forming the interlayer insulating layer further comprises the step of etching back part of a laminate of said first insulating film and said SOG film, from the surface of the laminate, after said step of forming said SOG film and before said step of forming said second insulating film.

9. A method of manufacturing a semiconductor device according to claim 8, wherein said conductive film is made of a material selected from a group consisting of Al, W, Ti, and alloys thereof.

10. A method of manufacturing a semiconductor device comprising the steps of:

forming a conductive film on a substrate of a semiconductor chip, said semiconductor chip having an inner pattern region where functional elements and wiring layers are formed, a bonding pad region outside said inner pattern region where bonding pads are formed, and a reserved region extending from an outer periphery of said bonding pad region to a chip periphery, respectively defined on said substrate;

forming dummy wiring patterns in said reserved region or in said bonding pad region and said reserved region, by selectively etching said conductive film; and forming an interlayer insulating layer including a coated insulating film over said substrate, said interlayer insulating layer covering said dummy wiring patterns.

11. A method of manufacturing a semiconductor device according to claim 10, wherein said coated insulating film is an SOG film.

12. A method of manufacturing a semiconductor device according to claim 11, wherein said step of forming the interlayer insulating layer comprises the steps of:

forming a first insulating film by CVD;

forming an SOG film on said first insulating film; and forming a second insulating film on said SOG film by CVD.

13. A method of manufacturing a semiconductor device according to claim 12, wherein said step of forming the interlayer insulating layer further comprises the step of etching back part of a laminate of said first insulating film and said SOG film, from the surface of the laminate, after said step of forming said SOG film and before said step of forming said second insulating film.

14. A method of manufacturing a semiconductor device according to claim 13, wherein said conductive film is made of a material selected from a group consisting of Al, W, Ti, and alloys thereof.

15. A method of manufacturing a semiconductor device according to claim 10, further comprising, after said step of forming the interlayer insulating layer, the step of forming dummy via holes in said interlayer insulating layer in said reserved region or in said bonding pad region and said reserved region, by selectively etching said interlayer insulating layer.

16. A method of manufacturing a semiconductor device according to claim 15, wherein said coated insulating film is an SOG film.

17. A method of manufacturing a semiconductor device according to claim 16, wherein said step of forming the interlayer insulating layer comprises the steps of:

forming a first insulating film by CVD;

forming an SOG film on said first insulating film; and forming a second insulating film on said SOG film by CVD.

18. A method of manufacturing a semiconductor device according to claim 17, wherein said step of forming the interlayer insulating layer further comprises the step of etching back part of a laminate of said first insulating film and said SOG film, from the surface of the laminate, after said step of forming said SOG film and before said step of forming said second insulating film.

19. A method of manufacturing a semiconductor device according to claim 15, further comprising, after said step of forming said dummy via holes, the steps of:

forming a conductive film in said dummy via holes and on said interlayer insulating layer; and forming dummy wiring patterns by selectively etching said conductive film, said dummy via holes being buried with said conductive film.

20. A method of manufacturing a semiconductor device according to claim 19, wherein said conductive film is made of a material selected from a group consisting of Al, W, Ti, and alloys thereof.

* * * * *